(12) United States Patent
Chang

(10) Patent No.: US 8,357,951 B2
(45) Date of Patent: Jan. 22, 2013

(54) LED CHIP HAVING FIRST CONDUCTION LAYER SURROUNDING A BOTTOM SURFACE AND A CIRCUMFERENTIAL SURFACE OF A SECOND CONDUCTION LAYER

(75) Inventor: Kuo-Cheng Chang, Chu-Nan (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 240 days.

(21) Appl. No.: 12/962,845

(22) Filed: Dec. 8, 2010

(65) Prior Publication Data
US 2012/0097981 A1    Apr. 26, 2012

(30) Foreign Application Priority Data
Oct. 21, 2010    (TW) ................................ 99135856 A

(51) Int. Cl.
*H01L 33/24* (2010.01)

(52) U.S. Cl. ................................... 257/99; 257/E33.007
(58) Field of Classification Search ........... 257/E33.006, 257/E33.007
See application file for complete search history.

(56) References Cited

U.S. PATENT DOCUMENTS 8,134,169 B2 *   3/2012   Yu et al. ......................... 257/94

* cited by examiner

*Primary Examiner* — Stephen W Smoot
(74) *Attorney, Agent, or Firm* — Altis Law Group, Inc.

(57) ABSTRACT

An LED (light emitting diode) chip includes a substrate, a first conduction layer formed on a top surface of the substrate, and a second conduction layer formed on the first conduction layer. The first conduction layer extends from a bottom surface of the second conduction layer to a circumferential surface of the second conduction layer, thereby surrounding the bottom surface and the circumferential surface of the second conduction layer. An active layer is sandwiched between the first and second conduction layers, to increase a contact area between the active layer and the first conduction layer and the second conduction layer.

6 Claims, 8 Drawing Sheets

LED CHIP HAVING FIRST CONDUCTION LAYER SURROUNDING A BOTTOM SURFACE AND A CIRCUMFERENTIAL SURFACE OF A SECOND CONDUCTION LAYER

BACKGROUND

1. Technical Field

The disclosure generally relates to a chip and, more particularly, to an LED chip.

2. Description of Related Art

LEDs are extensively applied to illumination devices due to high brightness, low working voltage, low power consumption, compatibility with integrated circuitry, simple driving operation, long lifetime and other factors.

LEDs have replaced incandescent lamps in many interior and outdoor illuminations, such as Christmas decorations, display window decorations, interior lamps, landscaping, streetlamps and traffic signs. An LED chip is the core of the LED. For example, a conventional LED chip includes an N-type conduction layer and a P-type conduction layer formed on a top surface of the N-type conduction layer. Generally speaking, a contact area between the N-type conduction layer and the P-type conduction layer is a light emitting area of the LED. However, for the conventional LED chip, the contact area between the N-type conduction layer and the P-type conduction layer is only a top surface area of the N-type conduction layer. Therefore, a light emitting efficiency of the conventional LED chip is low.

What is needed, therefore, is an LED chip which can overcome the described limitations.

BRIEF DESCRIPTION OF THE DRAWINGS

Many aspects of the present embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the various views.

DETAILED DESCRIPTION

Figure 1:
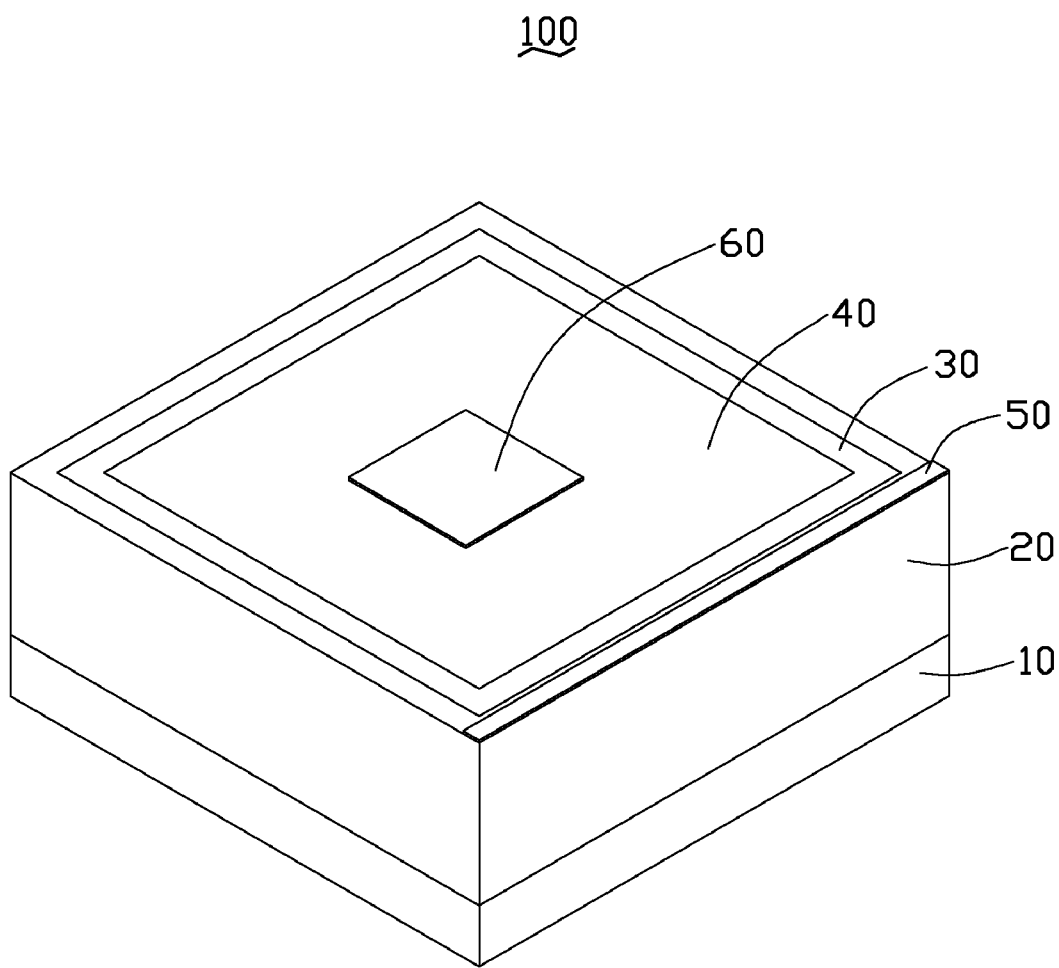
FIG. 1 is an isometric, assembled view of an LED chip in accordance with a first embodiment of the disclosure.
Figure 2:
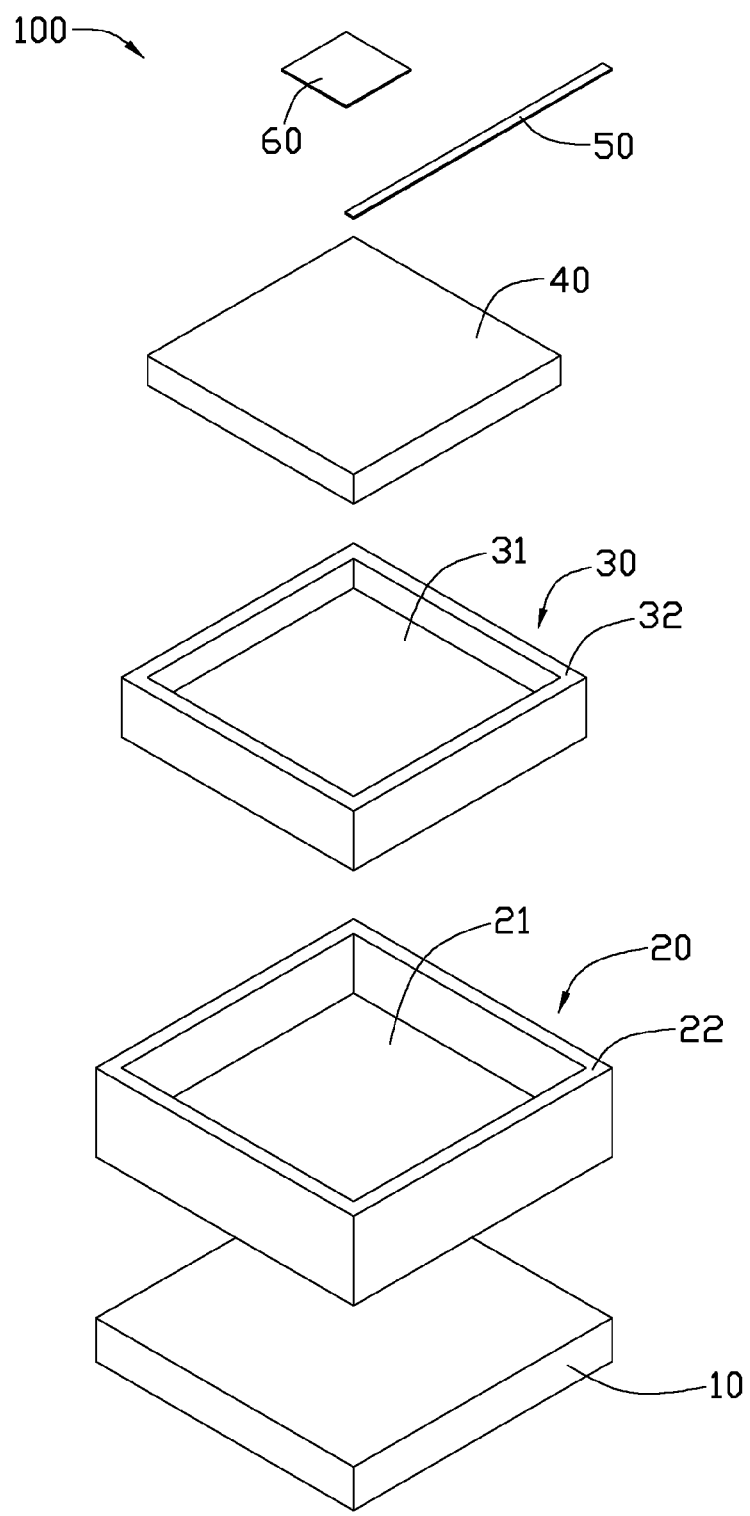
FIG. 2 is an exploded view of the LED chip of FIG. 1.
Figure 3:
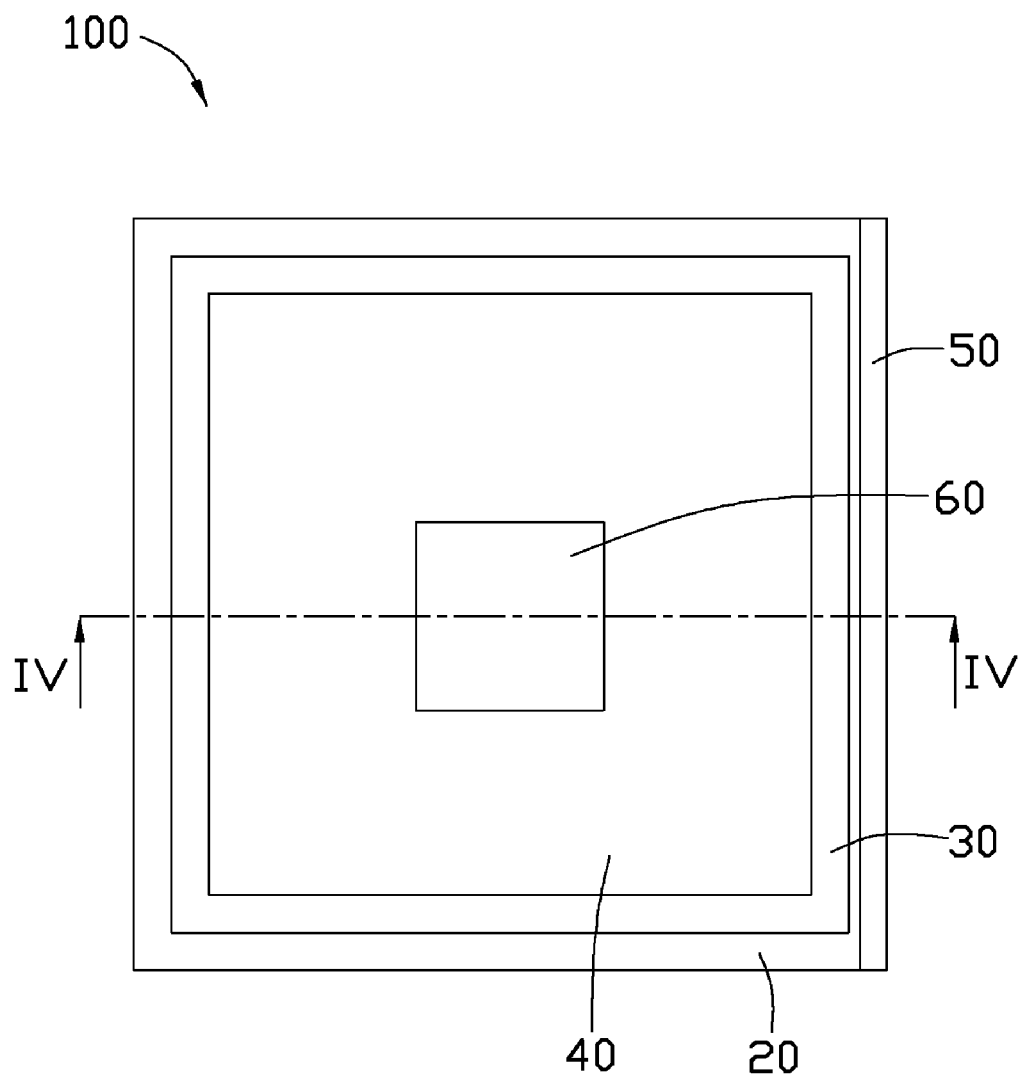
FIG. 3 is a top plan view of the LED chip of FIG. 1.
Figure 4:
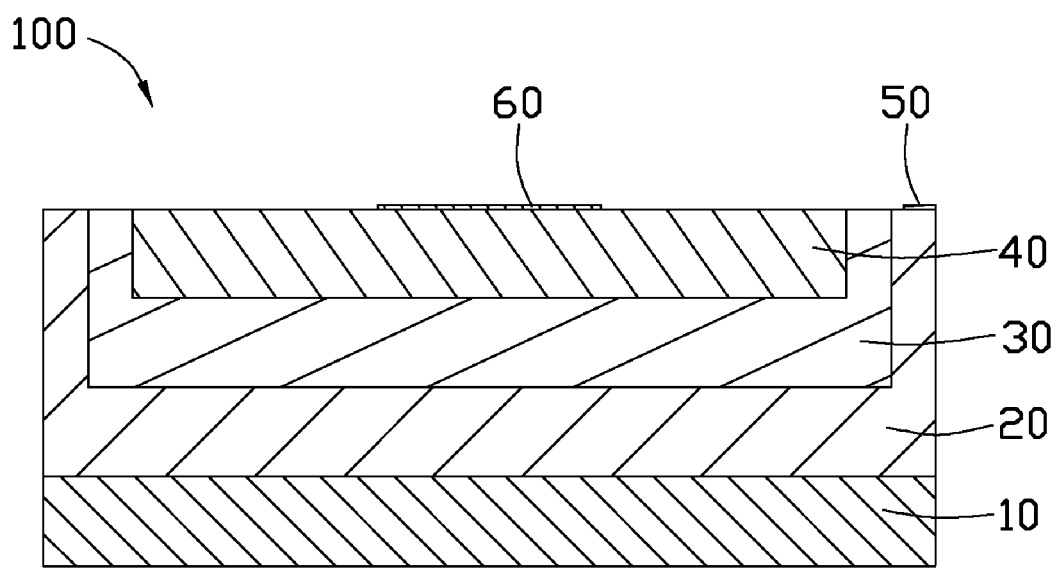
FIG. 4 is a sectional view of the LED chip of FIG. 3, taken along line IV-IV thereof.

Referring to FIGS. 1-4, an LED chip 100 in accordance with a first embodiment is illustrated. The LED chip 100 comprises a substrate 10, a first conduction layer 20, an active layer 30, a second conduction layer 40, a first electrode 60 and a second electrode 50. In this embodiment, the first conduction layer 20 is an N-type conduction layer, for example, N-type GaN layer; and the second conduction layer 40 is a P-type conduction layer, for example, P-type GaN layer. The active layer 30 is sandwiched between the first conduction layer 20 and the second conduction layer 40.

In this embodiment, the substrate 10 is an insulated substrate, for example, $Al_2O_3$ substrate. The first conduction layer 20 is formed on a top surface of the substrate 10. The first conduction layer 20 defines a first receiving space 21 in a central portion thereof, thereby forming a first circumferential wall 22 at a circumferential portion of the first conduction layer 20. The first circumferential wall 22 has a square annular configuration. The first circumferential wall 22 comprises four sidewalls. The first conduction layer 20 defines a bottom surface and four side surfaces of the first circumferential wall 22 are non-coplanar with the bottom surface of the first conduction layer 20. More specifically, the four side surfaces are extended perpendicularly and upwardly from the bottom surface. The active layer 30 defines a second receiving space 31 in a central portion thereof, thereby forming a second circumferential wall 32 at a circumferential portion of the active layer 30. The second circumferential wall 32 has a square annular configuration. The second circumferential wall 32 comprises four sidewalls. The active layer 30 defines a bottom surface and four side surfaces of the second circumferential wall 32 are non-coplanar with the bottom surface of the active layer 30. More specifically, the four side surfaces of the second circumferential wall 32 are extended perpendicularly and upwardly from the bottom surface of the active layer 30.

The active layer 30 is received in the first receiving space 21 of the first conduction layer 20. The bottom surface and the four side surfaces of the active layer 30 contact the bottom surface and the four side surfaces of the first conduction layer 20 defining the first receiving space 21 of the first conduction layer 20, correspondingly. A top surface of the second circumferential wall 32 of the active layer 30 is coplanar with a top surface of the first circumferential wall 22 of the first conduction layer 20.

The second conduction layer 40 is received in the second receiving space 31 of the active layer 30. A bottom surface and four side surfaces of the second conduction layer 40 contact the bottom surface and four side surfaces of the active layer 30 defining the second receiving space 31 of the active layer 30. A top surface of the second conduction layer 40 is coplanar with the top surface of the second circumferential wall 32 of the active layer 30.

The second electrode 50 has an elongated configuration. The second electrode 50 is attached to the top surface of the first circumferential wall 22 of the first conduction layer 20. In this embodiment, the second electrode 50 is attached to one of the sidewalls of the first circumferential wall 22. In other embodiments, the second electrode 50 is attached to all of the sidewalls of the first circumferential wall 22.

The first electrode 60 is attached to a central portion of the second conduction layer 40. In this embodiment, the first electrode 60 is square. In other embodiments, the first electrode 60 may be other shapes, for example, circular. Light is generated by the active layer 30 when a voltage is applied between the first electrode 60 and the second electrode 50.

In other embodiments, a current diffusing layer is formed on the top surface of the second conduction layer 40. The current diffusing layer is formed of a transparent and electrically conducting material, such as ITO, IZO, AZO.

Figure 5:
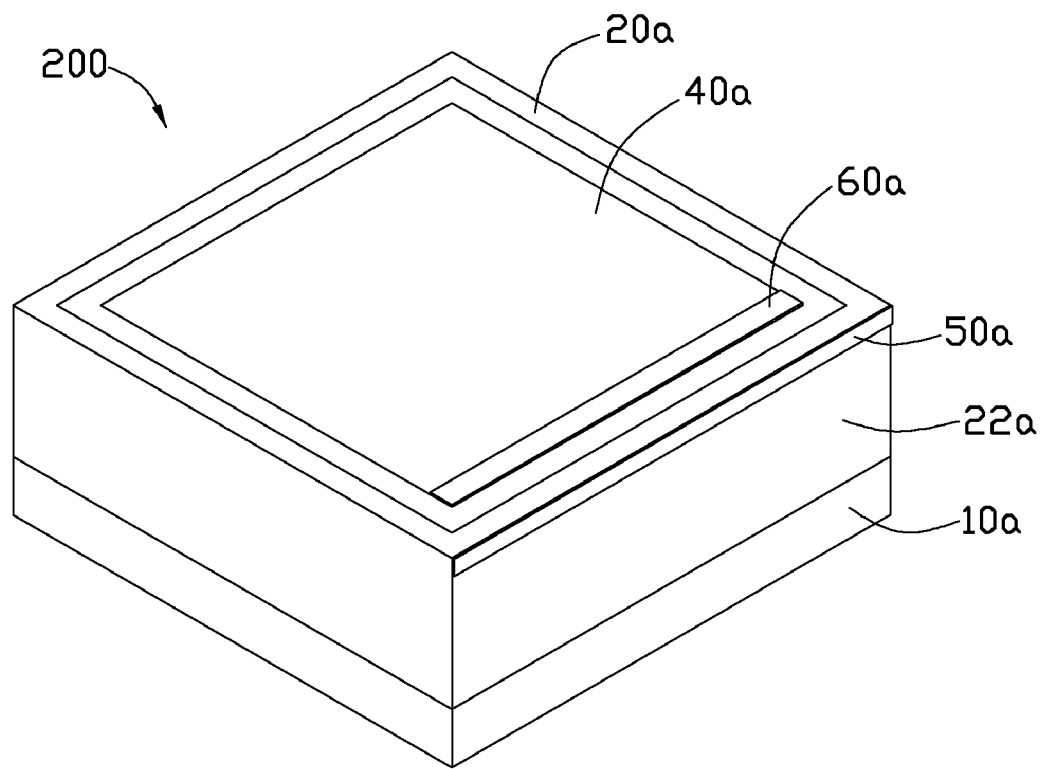
FIG. 5 is an isometric, assembled view of an LED chip in accordance with a second embodiment of the disclosure.
Figure 6:
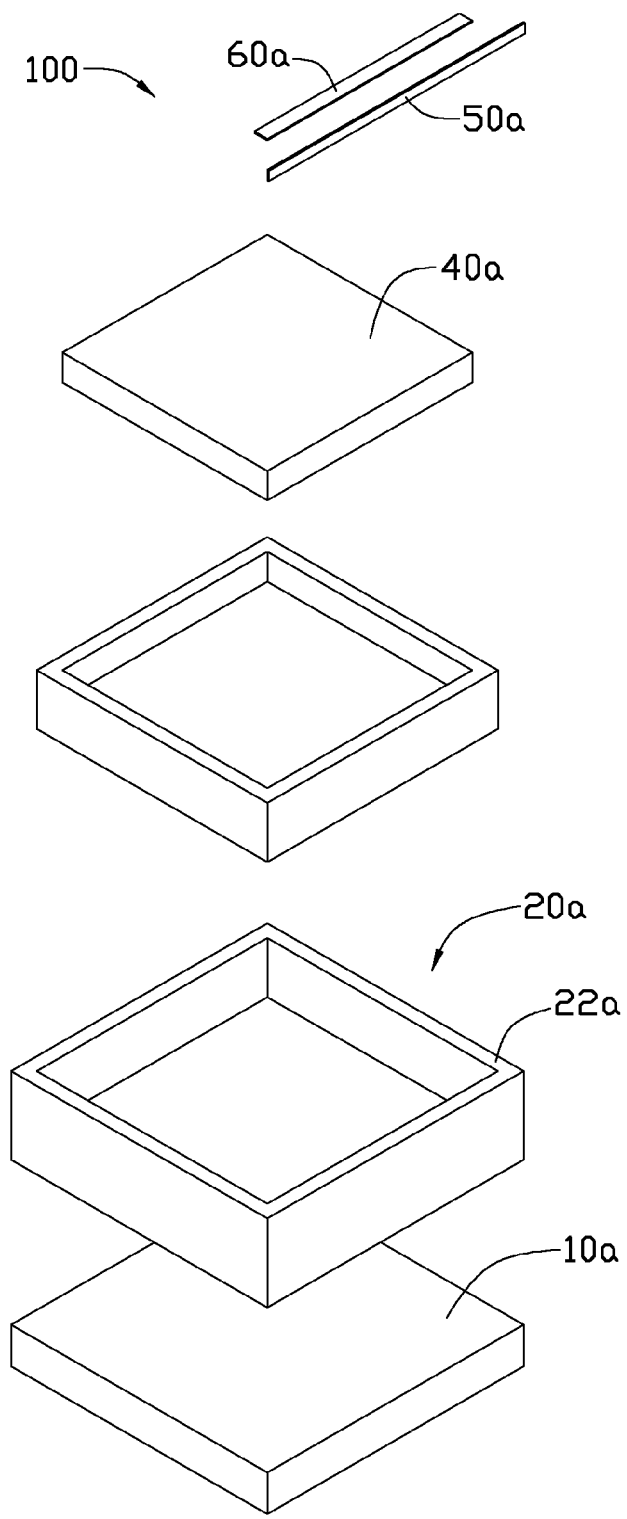
FIG. 6 is an exploded view of the LED chip of FIG. 5.
Figure 7:
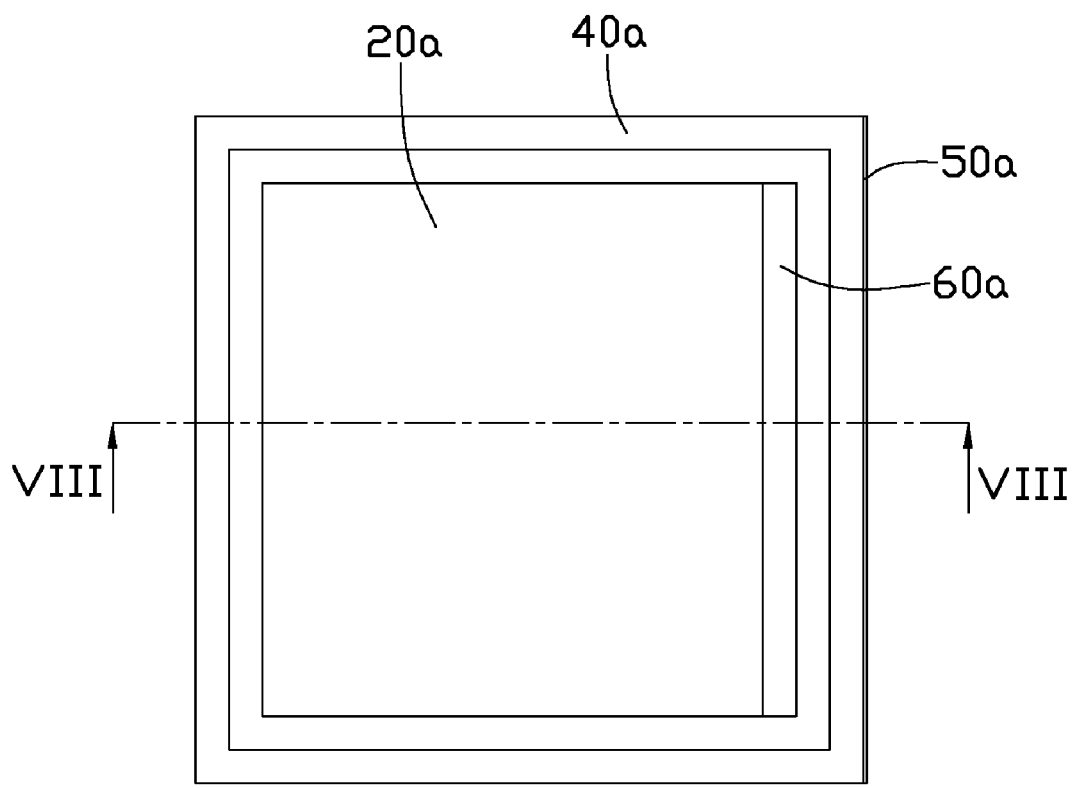
FIG. 7 is a top plan view of the LED chip of FIG. 5.
Figure 8:
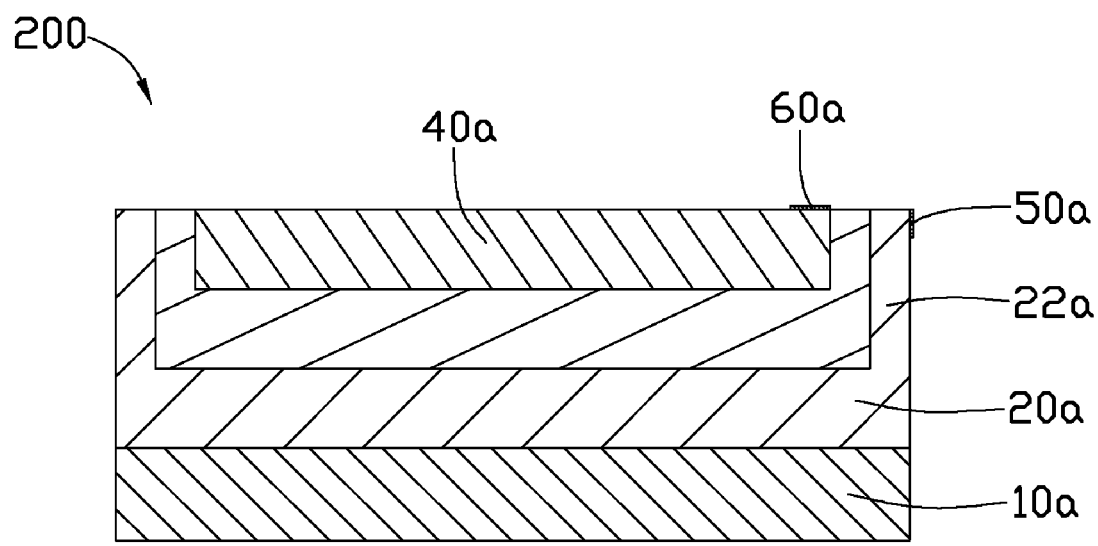
FIG. 8 is a sectional view of the LED chip of FIG. 7, taken along line VIII-VIII thereof.

Referring to FIGS. 5-8, an LED chip 200 in accordance with a second embodiment is illustrated. The LED chip 200 is similar to the LED chip 100. A main difference between the LED chip 200 and the LED chip 100 is the location of the first electrode 60a which is at a lateral side of a top surface of the second conduction layer 40a, the location of the second electrode 50a which at a top portion of an outer side surface the first circumferential wall 22a of the first conduction layer 20a and the shape of the first electrode 60*a*. Specifically, the second electrode 50*a* is attached to an outer side surface of one of the sidewalls of the first circumferential wall 22*a* of the first conduction layer 20*a*. The first electrode 60*a* is attached to a side portion of the top surface of the second conduction layer 40*a* near the second electrode 50*a*. The first electrode 60*a* has an elongated configuration. In other embodiments, the second electrode 50*a* may be attached to outer side surfaces of all of the sidewalls of the first circumferential wall 22*a* of the first conduction layer 20*a*.

In the first and second embodiments, the LED chip 100/200 disposes the active layer 30. In other embodiments, the LED chip 100/200 may not dispose the active layer 30; that is, the first conduction layer 20/20*a* is directly attached to the second conduction layer 40/40*a*.

In the present disclose, the first conduction layer 20/20*a* engages with the bottom surface and the circumferential surface of the active layer 30, and the active layer 30 engages with the bottom surface and the circumferential surface of the second conduction layer 40/40*a*, thereby increasing a light emitting area of the LED chip 100/200. Therefore, the light emitting efficiency of the LED chip 100/200 is increased. In addition, a heat dissipating area of the LED chip 100/200 is increased.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED (light emitting diode) chip comprising:
   a substrate;
   a first conduction layer formed on a top surface of the substrate;
   a second conduction layer formed on the first conduction layer; and
   an active layer;
   wherein the first conduction layer surrounds a bottom surface and a circumferential surface of the second conduction layer, light being generated between the first and second conduction layers when a voltage is applied between the first and second conduction layers;
   wherein the active layer is sandwiched between the first conduction layer and the second conduction layer, wherein the first conduction layer engages with a bottom surface and a circumferential surface of the active layer, and the active layer engages with the bottom surface and the circumferential surface of the second conduction layer; and
   wherein a top surface of the first conduction layer, a top surface of the active layer, and a top surface of the second conduction layer are coplanar with each other.

2. The LED chip of claim further comprising a first electrode, wherein the first electrode is attached to the top surface of the second conduction layer.

3. The LED chip of claim 2, wherein the first conduction layer is an N-type conduction layer, and the second conduction layer is a P-type conduction layer.

4. The LED chip of claim 2, wherein the substrate is an insulated substrate.

5. The LED chip of claim 4 further comprising a second electrode, wherein the second electrode is attached to a circumferential surface of the first conduction layer.

6. The LED chip of claim 4 further comprising a second electrode, wherein the second electrode is attached to the top surface of the first conduction layer.

* * * * *